United States Patent
Huang et al.

(10) Patent No.: US 10,700,003 B2
(45) Date of Patent: Jun. 30, 2020

(54) INTEGRATED CIRCUIT STRUCTURE, VOLTAGE-CONTROLLED OSCILLATOR AND POWER AMPLIFIER

(71) Applicant: REALTEK SEMICONDUCTOR CORPORATION, Hsinchu (TW)

(72) Inventors: Kai-Yi Huang, Taipei (TW); Sheng-Hung Lin, New Taipei (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 13 days.

(21) Appl. No.: 16/013,327

(22) Filed: Jun. 20, 2018

(65) Prior Publication Data
US 2019/0019749 A1   Jan. 17, 2019

(30) Foreign Application Priority Data
Jul. 13, 2017   (TW) ............... 106123441 A (51) Int. Cl.
| | |
|---|---|
| H01L 23/522 | (2006.01) |
| H01F 17/00 | (2006.01) |
| H01F 27/36 | (2006.01) |
| H01L 23/528 | (2006.01) |
| H01F 21/12 | (2006.01) |

(52) U.S. Cl.
CPC ..... *H01L 23/5227* (2013.01); *H01F 17/0006* (2013.01); *H01F 27/362* (2013.01); *H01L 23/528* (2013.01); *H01L 23/5223* (2013.01); *H01L 23/5225* (2013.01); *H01F 2017/008* (2013.01); *H01F 2021/125* (2013.01)

(58) Field of Classification Search
CPC ......... H01L 2924/0002; H01L 2924/00; H01L 23/5227; H01L 28/10
USPC ....... 336/200, 84 C, 155; 257/531, E27.046, 257/E21.022
See application file for complete search history.

(56) References Cited

U.S. PATENT DOCUMENTS

| | | | |
|---|---|---|---|
| 6,593,838 B2 | 7/2003 | Yue | |
| 8,559,186 B2 | 10/2013 | Jin | |
| 9,325,277 B1* | 4/2016 | Bekele | H03B 5/1253 |
| 9,443,842 B2 | 9/2016 | Lee et al. | |
| 2004/0124960 A1* | 7/2004 | Blanchard | H01L 27/08 336/200 |
| 2008/0029854 A1 | 2/2008 | Hung et al. | |

(Continued)

FOREIGN PATENT DOCUMENTS

TW   201620113   6/2016

*Primary Examiner* — Jonathan Han
(74) *Attorney, Agent, or Firm* — WPAT, PC (57) ABSTRACT

An integrated circuit structure includes a substrate, an integrated inductor, multiple components, multiple metal interconnections, a first shielding structure, and a second shielding structure. The integrated inductor is substantially formed in a first layer of the integrated circuit structure. The metal interconnections are coupled to the integrated inductor and the components. The first shielding structure is formed between the first layer and the substrate and is substantially beneath the integrated inductor. The second shielding structure is formed between the first layer and the substrate, has substantially the same distribution as the metal interconnections, and is substantially beneath the metal interconnections. The first shielding structure and the second shielding structure are equipotential.

12 Claims, 7 Drawing Sheets

(56) References Cited

U.S. PATENT DOCUMENTS

| | | | |
|---|---|---|---|
| 2014/0085012 A1* | 3/2014 | Wu ..................... | H03B 1/00 |
| | | | 331/8 |
| 2014/0117496 A1* | 5/2014 | Cheng ................. | H01L 23/552 |
| | | | 257/531 |
| 2016/0056799 A1* | 2/2016 | Ximenes ............. | H03B 5/1265 |
| | | | 331/74 |

* cited by examiner

INTEGRATED CIRCUIT STRUCTURE, VOLTAGE-CONTROLLED OSCILLATOR AND POWER AMPLIFIER

BACKGROUND OF THE INVENTION

1. Field of the Invention

The present invention generally relates to integrated circuits, and, more particularly, to integrated circuit structures, voltage-controlled oscillators (VCOs), and power amplifiers, all of which have integrated inductors.

2. Description of Related Art

Figure 1:
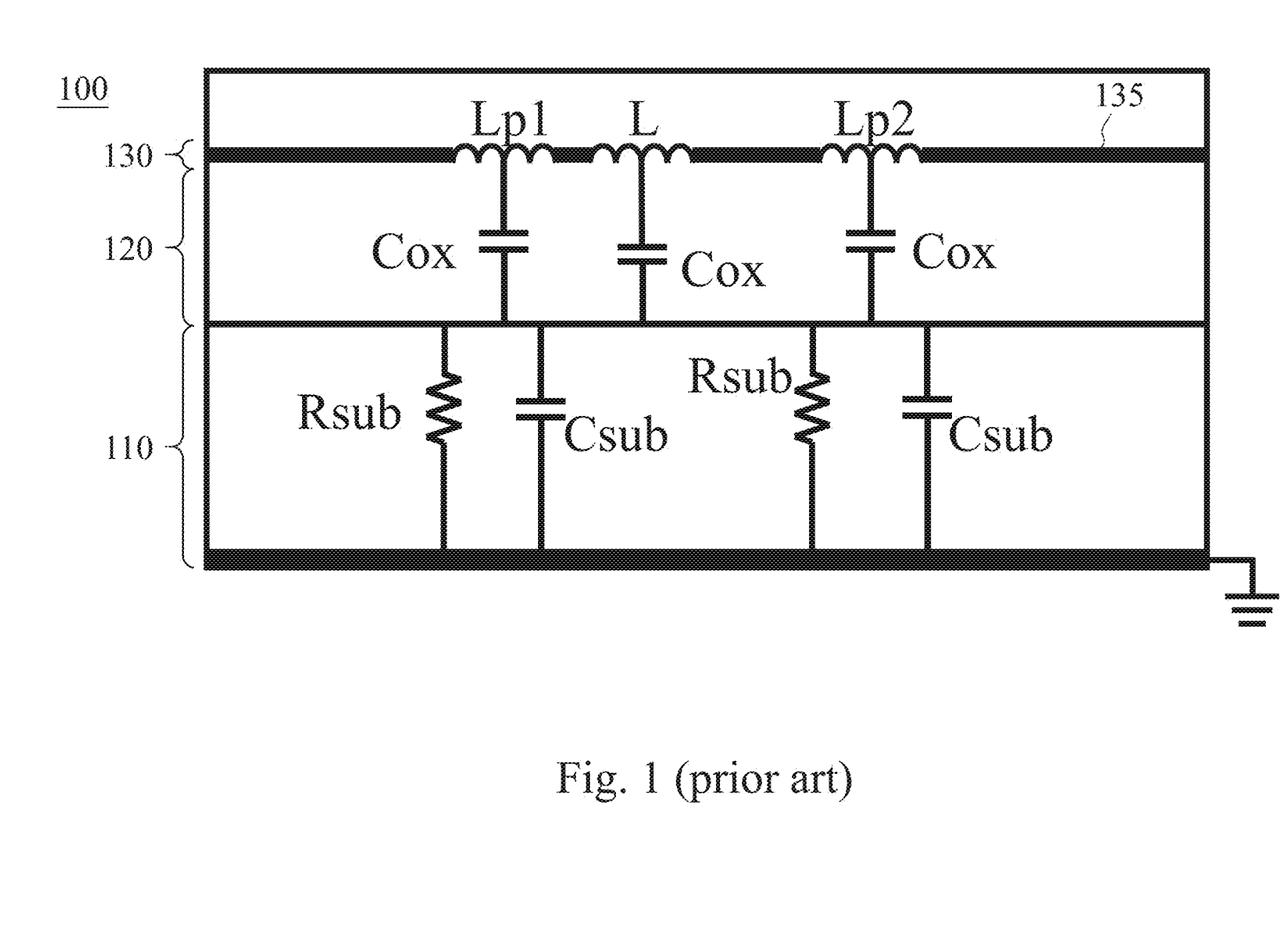
FIG. 1 illustrates a schematic cross-sectional view of a conventional integrated circuit structure containing an integrated inductor.

FIG. 1 is a schematic cross-sectional view of a conventional integrated circuit structure having an integrated inductor. The integrated inductor L is implemented in the metal layer 130 of the integrated circuit structure 100. The metal interconnection 135 in the same metal layer 130 connects the integrated inductor L and other components (not shown). In other conventional integrated circuit structures, some or all of the metal interconnections 135 may be implemented in metal layers other than the metal layer 130 and connected through vias or via arrays. An oxide layer 120 is fabricated between the metal layer 130 and the substrate 110. The oxide layer 120 is formed with oxide layer capacitors Cox, and the parasitic resistors and parasitic capacitors of the substrate 110 are represented by parasitic resistors Rsub and parasitic capacitors Csub, respectively.

The metal interconnection 135 is connected in series with the inductor L and has the parasitic inductors Lp1 and Lp2. When the circuit is operated at high frequencies, the high-frequency signals transmitted in the integrated inductor L and the metal interconnection 135 are coupled to the parasitic resistor Rsub and the parasitic capacitor Csub of the substrate 110 through the oxide layer capacitors Cox, which results in energy loss. The energy loss decreases the overall quality factor Q of the integrated inductor L and the metal interconnection 135, which is connected in series with the inductor L. Therefore, it is necessary to propose an integrated circuit structure to reduce the energy loss.

SUMMARY OF THE INVENTION

In view of the issues of the prior art, an object of the present invention is to provide an integrated circuit structure, a voltage-controlled oscillator (VCO), and a power amplifier to reduce the energy loss of an integrated inductor, so as to make an improvement to the prior art.

An integrated circuit structure is provided. The integrated circuit structure includes a substrate, an integrated inductor, multiple components, multiple metal interconnections, a first shielding structure, and a second shielding structure. The integrated inductor is substantially formed in a first layer of the integrated circuit structure. The metal interconnections are coupled to the integrated inductor and the components. The first shielding structure is formed between the first layer and the substrate and disposed substantially beneath the integrated inductor. The second shielding structure which is formed between the first layer and the substrate has substantially the same distribution as the metal interconnections and is disposed substantially beneath the metal interconnections. The first shielding structure and the second shielding structure are equipotential.

A VCO fabricated with an integrated circuit structure is also provided. The VCO includes a substrate, an integrated inductor, a switch, a capacitor, a metal interconnection, a first shielding structure, and a second shielding structure. The integrated inductor is substantially formed in a first layer of the integrated circuit structure. The capacitor has one terminal coupled to the integrated inductor and the other terminal coupled to a reference voltage through the switch. The metal interconnection connects the integrated inductor and the capacitor. The first shielding structure is formed between the first layer and the substrate and disposed substantially beneath the integrated inductor. The second shielding structure is formed between the first layer and the substrate and disposed substantially beneath the metal interconnection. The first shielding structure and the second shielding structure are equipotential.

A power amplifier fabricated with an integrated circuit structure is also provided. The power amplifier includes a substrate, an integrated inductor, a switch, a capacitor, a metal interconnection, a first shielding structure, and a second shielding structure. The integrated inductor is substantially formed in a first layer of the integrated circuit structure. The capacitor has one terminal coupled to the integrated inductor and the other terminal coupled to a reference voltage through the switch. The metal interconnection connects the integrated inductor and the capacitor. The first shielding structure is formed between the first layer and the substrate and disposed substantially beneath the integrated inductor. The second shielding structure is formed between the first layer and the substrate and disposed substantially beneath the metal interconnection. The first shielding structure and the second shielding structure are equipotential.

The integrated circuit structure, the VCO, and the power amplifier of the present invention can prevent the signals on the integrated inductor from being coupled to the substrate and prevent the signals on the metal interconnections connected to the integrated inductor from being coupled to the substrate. Compared with the conventional technology, the integrated circuit structure, the VCO, and the power amplifier of the invention effectively reduce the energy loss in the integrated inductor. As a result, the inductance and the quality factor Q of the integrated inductor are improved, thereby enhancing the performance of the entire integrated circuit.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes an integrated circuit structure, a voltage-controlled oscillator (VCO), and a power amplifier. On account of that some or all elements of the integrated circuit structure, the voltage-controlled oscillator, and the power amplifier could be known, the detail of such elements is omitted provided that such detail has little to do with the features of this disclosure and this omission nowhere dissatisfies the specification and enablement requirements. A person having ordinary skill in the art can choose components or steps equivalent to those described in this specification to carry out the present invention, which means that the scope of this invention is not limited to the embodiments in the specification.

Figure 2:
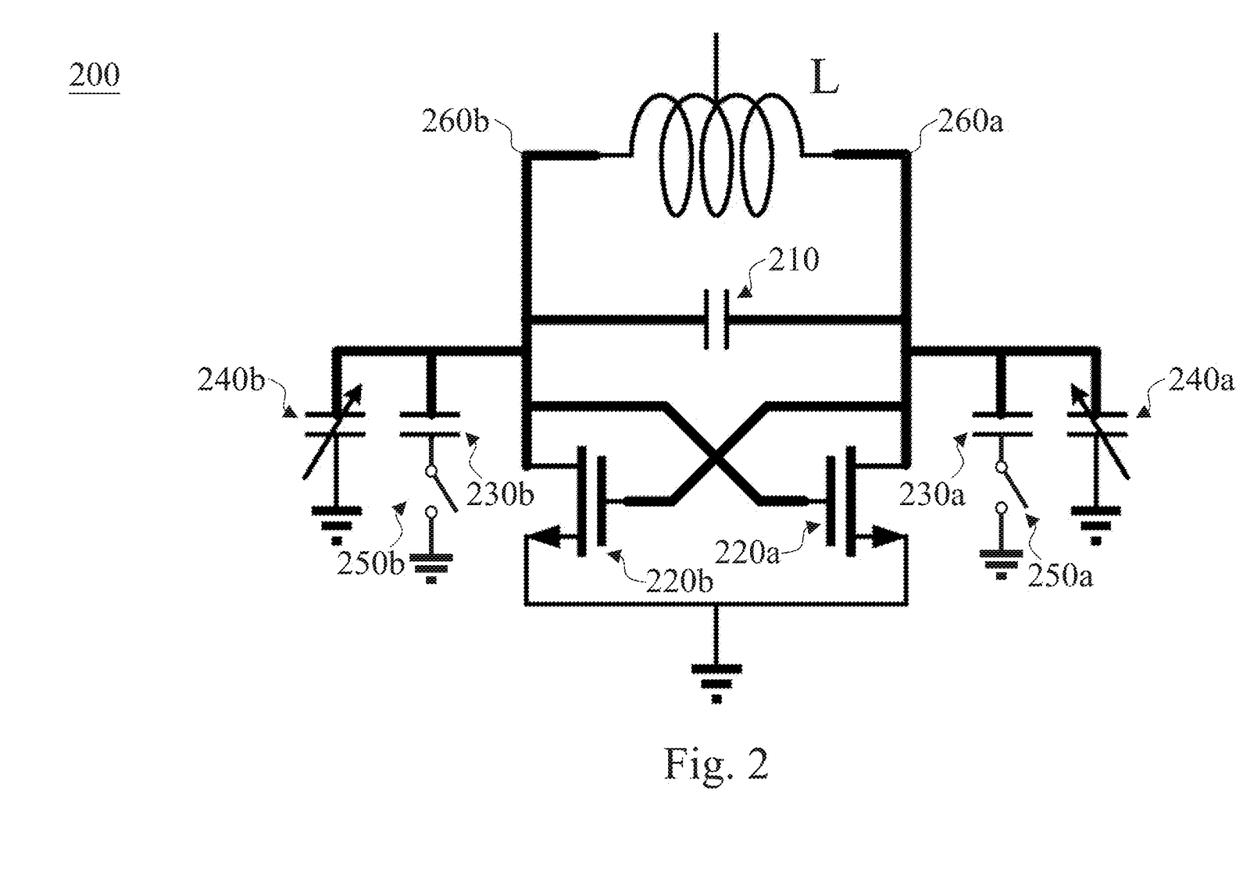
FIG. 2 illustrates a circuit diagram of the LC tank of a voltage-controlled oscillator (VCO).

FIG. 2 is a circuit diagram of the LC tank of a VCO. The body of the LC tank 200 is an integrated inductor L, a capacitor 210, and two transistors 220a and 220b. Both terminals of the integrated inductor L are connected to a switch capacitor array. The switch capacitor array includes two capacitors 230a and 230b and two switches 250a and 250b. The switch capacitor array may also include two variable capacitors 240a and 240b. The integrated inductor L is coupled to other components (e.g., passive components such as resistors and capacitors, or active components such as transistors) through multiple metal interconnections 260a and 260b (represented by thick lines in the figure). More specifically, the integrated inductor L is connected to the capacitor 210, the drain of the transistor 220a, the gate of the transistor 220b, the capacitor 230a, and the variable capacitor 240a through the metal interconnection 260a, and connected to the capacitor 210, the drain of the transistor 220b, the gate of the transistor 220a, the capacitor 230b, and the variable capacitor 240b through the metal interconnection 260b. One terminal of the integrated inductor L is coupled to the switch 250a through the capacitor 230a, and the other terminal is coupled to the switch 250b through the capacitor 230b. When the switches 250a and 250b are switched (e.g., turned on or off at the same time), the equivalent capacitance in parallel with the integrated inductor L changes, resulting in the change in the resonant frequency of the LC tank.

Reference is made to FIGS. 1 and 2. The integrated inductor L and the metal interconnections 260a and 260b of FIG. 2 may correspond to the integrated inductor L and the metal interconnection 135 of FIG. 1. As mentioned above, because both the integrated inductor L and the metal interconnection 135 may be coupled to the parasitic resistors Rsub and the parasitic capacitors Csub of the substrate 110 through the oxide layer capacitors Cox, the overall performance of the LC tank of FIG. 2 can be improved if the signal coupling between the integrated inductor L and the substrate and the signal coupling between the metal interconnections 260a and 260b and the substrate are blocked.

Figure 3A:
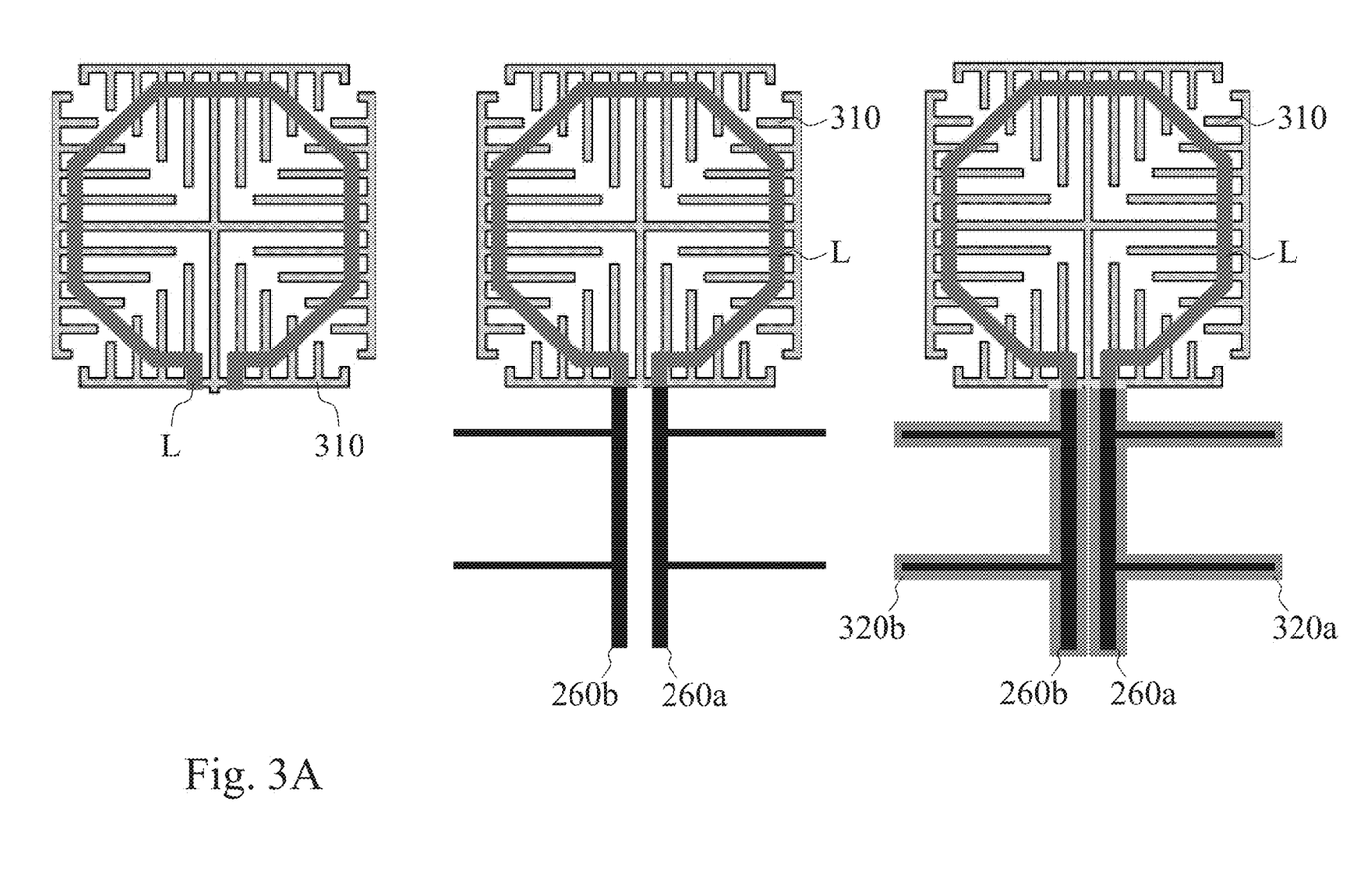
FIGS. 3A and 3B illustrates how the shielding structure affects the inductance and the quality factor Q of the integrated inductor.
Figure 3B:
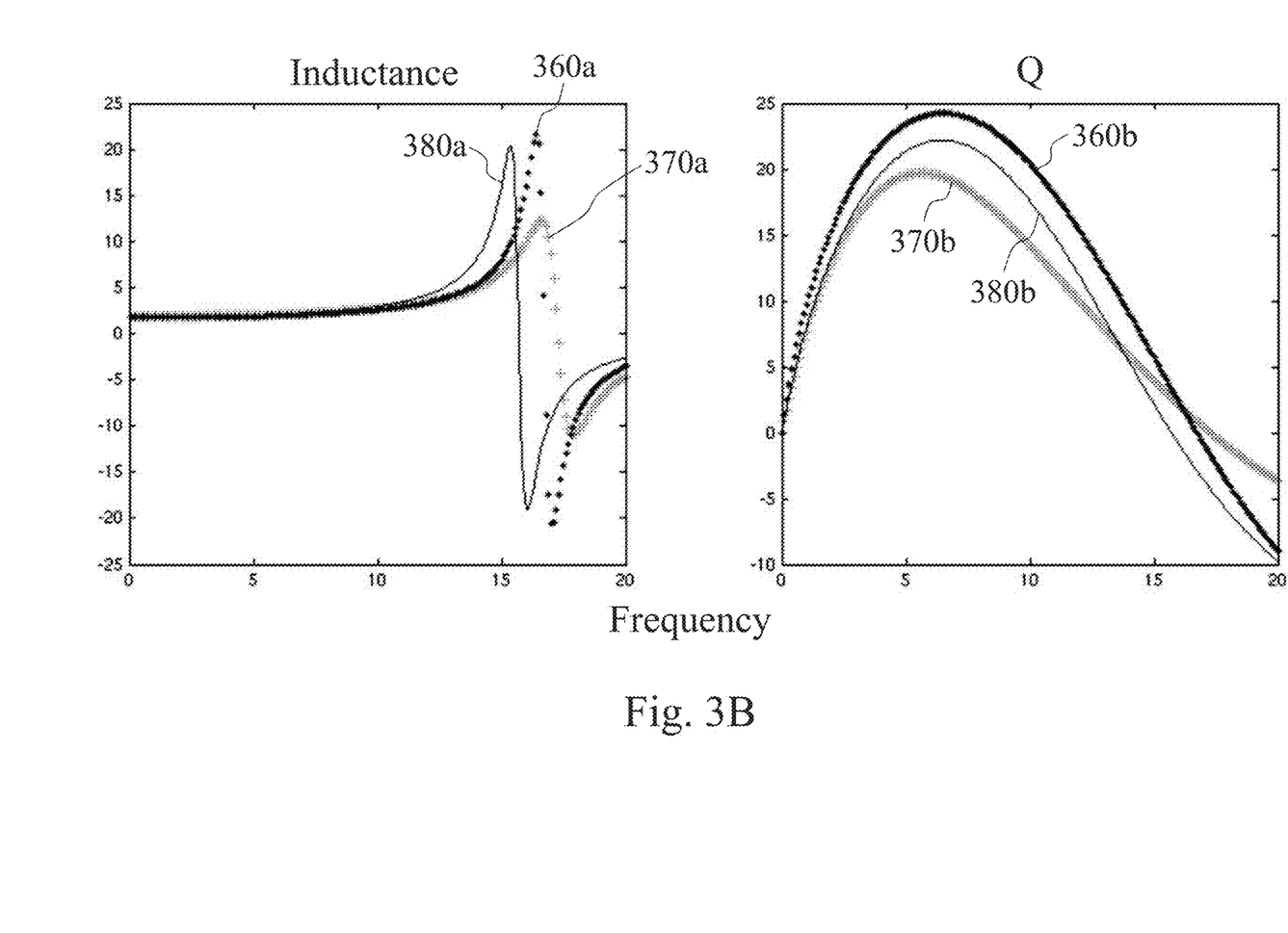

FIGS. 3A and 3B show how the shielding structure affects the inductance and the quality factor Q of the integrated inductor. FIG. 3A is a top view. The left diagram of FIG. 3A shows the integrated inductor L and the shielding structure 310 for the integrated inductor L; the center diagram of FIG. 3A shows the integrated inductor L, the shielding structure 310, and the metal interconnections 260a and 260b; the right diagram of FIG. 3A shows the integrated inductor L, the shielding structure 310, the metal interconnections 260a, 260b, and the shielding structures 320a, 320b (marked in gray) for the metal interconnections 260a, 260b. The shielding structure 310 is disposed between the substrate and the semiconductor layer in which the integrated inductor L is substantially fabricated and is substantially beneath the integrated inductor L. The shielding structures 320a and 320b are disposed between the substrate and the semiconductor layer(s) in which the metal interconnections 260a and 260b are substantially fabricated and are substantially beneath the metal interconnections 260a and 260b. In some embodiments, the distribution of the shielding structure 320 (including 320a and 320b) is substantially the same as the distribution of the metal interconnection 260 (including 260a and 260b). In contrast, in other embodiments, the distribution of the shielding structure 320 is different from the distribution of the metal interconnection 260; for example, the shielding structure 320 may be a bulk metal sheet/plate, which may be rectangular, hexagonal, octagonal or in other shapes, and the metal sheet/plate covers more than a certain percentage (e.g., 90%) of the area of the metal interconnection 260. In some embodiments, the integrated inductor L is substantially disposed in the same layer of the integrated circuit structure, the metal interconnections 260a and 260b are disposed in the same layer as the integrated inductor L, and the shielding structure 310 and the shielding structures 320a and 320b are disposed in the same layer of the integrated circuit structure. In some embodiments, the shielding structure 310 and the shielding structures 320a, 320b are coupled to the same electric potential (e.g., ground).

FIG. 3B shows the inductance and quality factor Q corresponding to the three structures in FIG. 3A. The structure in the left diagram of FIG. 3A corresponds to the curves 360a and 360b of FIG. 3B. The structure in the center diagram of FIG. 3A corresponds to the curves 370a and 370b of FIG. 3B. The structure in the right diagram of FIG. 3A corresponds to the curves 380a and 380b of FIG. 3B. Observe that from the case where the integrated inductor L is not connected to the metal interconnections (as shown in the left diagram of FIG. 3A) to the case where the integrated inductor L and metal interconnections are connected (as shown in the center diagram of FIG. 3A), both the inductance and the quality factor Q decrease dramatically (from curve 360 to curve 370). However, after the shielding structures 320 are added to the metal interconnection 260 (as shown in the right diagram of FIG. 3A), the inductance and the quality factor Q are significantly improved (as shown by the curve 380). Thus, adding shielding structures between the integrated inductor and the substrate and between the metal interconnections and the substrate can effectively improve the performance of the circuit.

Figure 4:
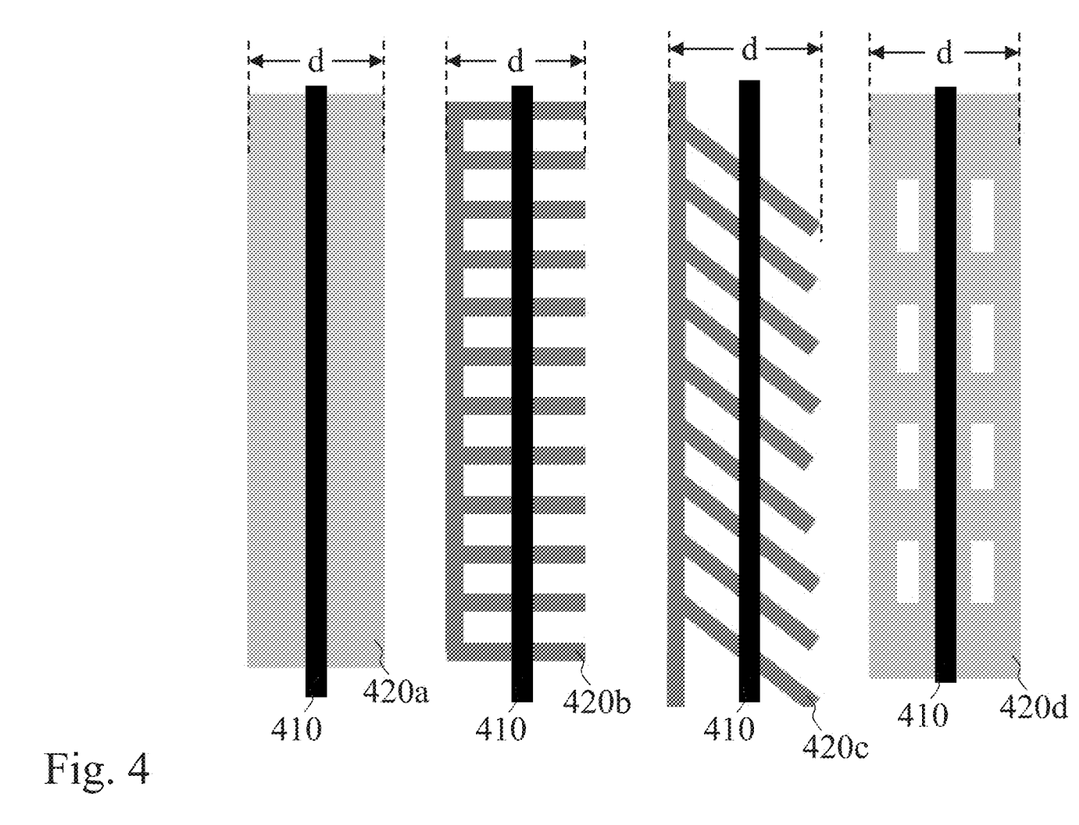
FIG. 4 illustrates patterns of the shielding structure for the metal interconnection.

FIG. 4 shows patterns of the shielding structure for the metal interconnection. The shielding structure 420 of the metal interconnection 410 may be solid (420a), horizontal comb (420b), oblique comb (420c), or mesh (420d). In some embodiments, the width d of the shielding structure 420 is greater than the width of the metal interconnection 410.

Figure 5:
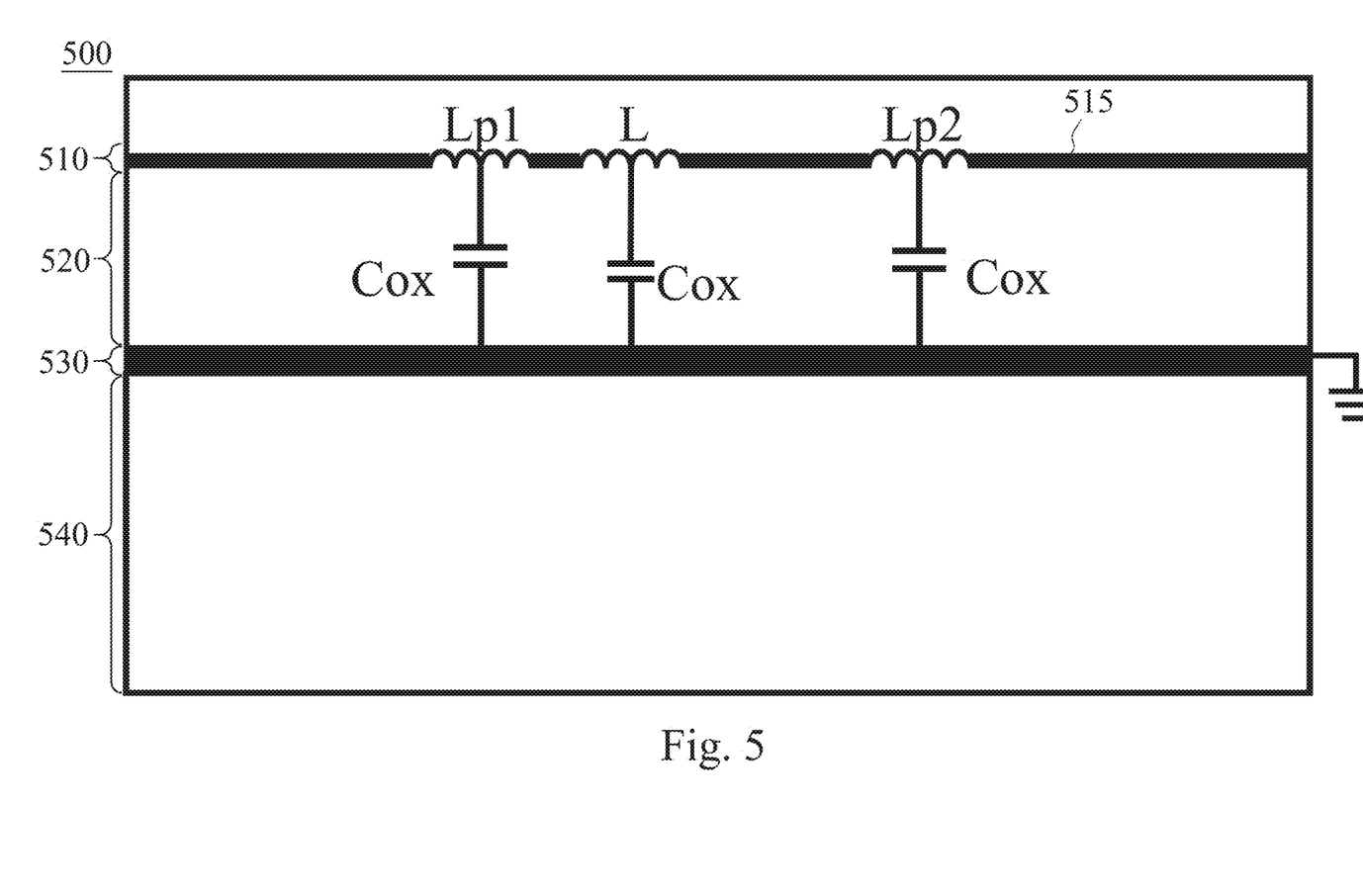
FIG. 5 illustrates a schematic cross-sectional view of an integrated circuit structure according to an embodiment of the present invention.

FIG. 5 is a schematic cross-sectional view of an integrated circuit structure according to an embodiment of the present invention. The integrated circuit structure 500 includes at least a metal layer 510, an oxide layer 520, a shielding layer 530, and a substrate 540. In some embodiments, the integrated inductor L and the metal interconnection 515 are substantially disposed in the metal layer 510. In other embodiments, some or all of the metal interconnections 515 may be implemented in metal layers other than the metal layer 510 and connected through vias or via arrays. As shown in the figure, the shielding layer 530, which includes the shielding structure for the integrated inductor L and the shielding structure for the metal interconnection 515, is disposed between the substrate 540 and the metal layer 510. The shielding layer 530 not only blocks the signals from being coupled to the substrate through the integrated inductor L and the oxide layer capacitors Cox, but also blocks the signals from being coupled to the substrate through the metal interconnection 515 and/or the parasitic inductors (e.g., Lp1 and Lp2) of the metal interconnection 515 as well as through the oxide layer capacitor Cox.

In some embodiments, the shielding layer 530 may be formed in the metal layer closest to the substrate 540 in the integrated circuit structure 500 for the purpose of increasing the distance between the integrated inductor L and the shielding structure as well as the distance between the metal interconnection 515 and the shielding structure to thereby decrease the capacitances of oxide layer capacitors Cox. In addition to metal, the material of the shielding layer 530 may also be a polysilicon layer or a diffusion layer covered with silicide.

Figure 6:
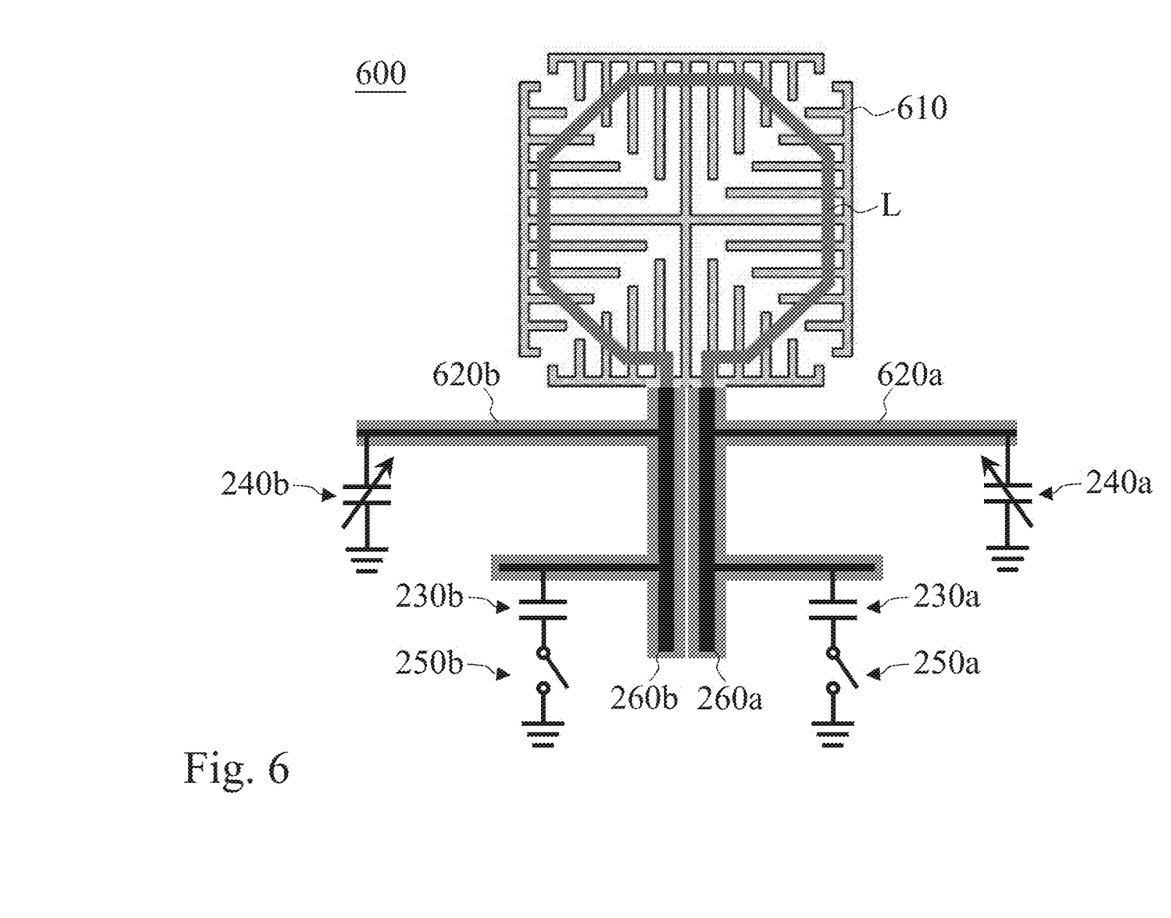
FIG. 6 illustrates a schematic diagram of an integrated circuit structure according to an embodiment of the present invention.

FIG. 6 is a schematic diagram of an integrated circuit structure according to an embodiment of the present invention, and FIG. 6 may correspond to some components of FIG. 2. The integrated inductor L is connected to the capacitor 230a and the variable capacitor 240a through the metal interconnection 260a and connected to the capacitor 230b and the variable capacitor 240b through the metal interconnection 260b. The capacitors 230a and 230b are coupled to a reference electric potential (e.g., ground) through the switches 250a and 250b, respectively. The capacitors 230a and 230b may be implemented between the layer in which the integrated inductor L is disposed and the substrate. The shielding structure 610 prevents signals on the integrated inductor L from being coupled to the substrate, and the shielding structures 620a and 620b respectively prevent signals on the metal interconnections 260a and 260b from being coupled to the substrate. The integrated circuit structure 600 may be applied to a power amplifier or a VCO. When the switches 250a and 250b are switched on, the integrated inductor L is equivalently connected in parallel with the capacitors 230a and 230b. Therefore, the operating frequency of the power amplifier or the VCO can be adjusted by turning on or off the switches 250a and 250b. In some embodiments, the switches 250a and 250b may be implemented by transistors and may be implemented in the same layer in the integrated circuit structure as the shielding structures 610, 620a and 620b. For example, the switches 250a and 250b may be implemented in the metal layer closest to the substrate.

In addition to the power amplifier and VCO, the integrated circuit structure of the present invention can also be applied to a low noise amplifier (LNA) or other circuits. In addition, the integrated circuit structure disclosed in the present invention can be applied not only to the integrated inductor and its metal interconnection(s), but also to the integrated transformer and its metal interconnection(s) (for example, the foregoing integrated inductor can be regarded as part of an integrated transformer).

Since a person having ordinary skill in the art can appreciate the implementation detail and the modification thereto of the present method invention through the disclosure of the device invention, repeated and redundant description is thus omitted. Furthermore, the shape, size, and ratio of any element in the disclosed figures are exemplary for understanding, not for limiting the scope of this invention. In addition, although the embodiments discussed above take the integrated inductor as an example, this is not a limitation to the present invention. Those skilled in the art can properly apply the present invention to the integrated transformer according to the disclosure of the present invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. An integrated circuit structure comprising:
   a substrate;
   an integrated inductor substantially formed in a first layer of the integrated circuit structure;
   a plurality of components;
   a plurality of metal interconnections coupled to the integrated inductor and the components;
   a first shielding structure formed between the first layer and the substrate and disposed substantially beneath the integrated inductor; and
   a second shielding structure which is formed between the first layer and the substrate, has substantially the same distribution in shape from a top view as the metal interconnections, and is disposed substantially beneath the metal interconnections;
   wherein the first shielding structure and the second shielding structure are equipotential.

2. The integrated circuit structure of claim 1, wherein the integrated circuit structure is applied to an LC tank, and the components comprise:
   a first switch;
   a second switch;
   a first capacitor having one terminal coupled to a first terminal of the integrated inductor and the other terminal coupled to a reference voltage through the first switch; and
   a second capacitor having one terminal coupled to a second terminal of the integrated inductor and the other terminal coupled to the reference voltage through the second switch;
   wherein the first switch, the second switch, the first capacitor, and the second capacitor form a switch capacitor array, and the first switch and the second switch are simultaneously turned on or off to adjust the resonant frequency of the LC tank.

3. The integrated circuit structure of claim 2, wherein the first capacitor and the second capacitor are formed between the first layer and the substrate, the first switch and the second switch are implemented by transistors, and the electrodes of the transistors are formed in the same layer as the second shielding structure.

4. The integrated circuit structure of claim 1, wherein the second shielding structure is implemented in a metal layer closest to the substrate in the integrated circuit structure.

5. The integrated circuit structure of claim 1, wherein the integrated circuit structure is an integrated circuit structure of a low noise amplifier.

6. The integrated circuit structure of claim 5, wherein the second shielding structure is implemented in a metal layer closest to the substrate in the integrated circuit structure.

7. A voltage-controlled oscillator (VCO) fabricated with an integrated circuit structure, comprising:
- a substrate;
- an integrated inductor substantially formed in a first layer of the integrated circuit structure;
- a switch;
- a capacitor having one terminal coupled to the integrated inductor and the other terminal coupled to a reference voltage through the switch;
- a metal interconnection connecting the integrated inductor and the capacitor;
- a first shielding structure formed between the first layer and the substrate and disposed substantially beneath the integrated inductor; and
- a second shielding structure formed between the first layer and the substrate, disposed substantially beneath the metal interconnection, and having substantially the same distribution in shape from a top view as the metal interconnection;
- wherein the first shielding structure and the second shielding structure are equipotential.

8. The VCO of claim 7, wherein the capacitor is formed between the first layer and the substrate, the switch is implemented by a transistor, and the electrode of the transistor is implemented in the same layer as the second shielding structure.

9. The VCO of claim 7, wherein the second shielding structure is implemented in a metal layer closest to the substrate in the integrated circuit structure.

10. A power amplifier fabricated with an integrated circuit structure, comprising:
- a substrate;
- an integrated inductor substantially formed in a first layer of the integrated circuit structure;
- a switch;
- a capacitor having one terminal coupled to the integrated inductor and the other terminal coupled to a reference voltage through the switch;
- a metal interconnection connecting the integrated inductor and the capacitor;
- a first shielding structure formed between the first layer and the substrate and disposed substantially beneath the integrated inductor; and
- a second shielding structure formed between the first layer and the substrate, disposed substantially beneath the metal interconnection, and having substantially the same distribution in shape from a top view as the metal interconnection;
- wherein the first shielding structure and the second shielding structure are equipotential.

11. The power amplifier of claim 10, wherein the capacitor is formed between the first layer and the substrate, the switch is implemented by a transistor, and the electrode of the transistor is implemented in the same layer as the second shielding structure.

12. The power amplifier of claim 10, wherein the second shielding structure is implemented in a metal layer closest to the substrate in the integrated circuit structure.

* * * * *